US009859446B2

(12) United States Patent
Hayashi

(10) Patent No.: US 9,859,446 B2
(45) Date of Patent: Jan. 2, 2018

(54) NON-VOLATILE SEMICONDUCTOR MEMORY DEVICE

(71) Applicant: TOSHIBA MEMORY CORPORATION, Tokyo (JP)

(72) Inventor: Takashi Hayashi, Shiga (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/261,162

(22) Filed: Sep. 9, 2016

(65) Prior Publication Data

US 2017/0263779 A1 Sep. 14, 2017

Related U.S. Application Data

(60) Provisional application No. 62/306,993, filed on Mar. 11, 2016.

(51) Int. Cl.

| | |
|---|---|
| ***H01L 29/788*** | (2006.01) |
| ***H01L 29/51*** | (2006.01) |
| ***H01L 29/792*** | (2006.01) |
| ***H01L 29/423*** | (2006.01) |

(52) U.S. Cl.

CPC .... *H01L 29/7883* (2013.01); *H01L 29/42324* (2013.01); *H01L 29/513* (2013.01); *H01L 29/517* (2013.01); *H01L 29/792* (2013.01)

(58) Field of Classification Search

CPC ......... H01L 21/28273; H01L 27/11521; H01L 29/792; H01L 21/28282; H01L 27/11568; H01L 29/7881; H01L 21/02697; H01L 29/42324; H01L 29/4234; H01L 29/66825; H01L 29/66833; H01L 29/788; G11C 16/0408

USPC .......................... 257/316, 326; 438/593, 591

See application file for complete search history.

(56) References Cited

U.S. PATENT DOCUMENTS

| | | | | |
|---|---|---|---|---|
| 2002/0154545 A1* | 10/2002 | Tanaka | G11C 16/344 | 365/185.22 |
| 2011/0169122 A1* | 7/2011 | Oliver | H01L 21/768 | 257/459 |
| 2013/0063631 A1* | 3/2013 | Fujiki | H01L 27/14612 | 348/294 |
| 2013/0240978 A1 | 9/2013 | Tanaka et al. | | |

(Continued)

FOREIGN PATENT DOCUMENTS

| | | |
|---|---|---|
| JP | 2013-197191 A | 9/2013 |
| JP | 2014-003235 A | 1/2014 |
| JP | 2014-003236 A | 1/2014 |

*Primary Examiner* — William F Kraig
*Assistant Examiner* — Edward Chin
(74) *Attorney, Agent, or Firm* — Foley & Lardner LLP

(57) ABSTRACT

According to one embodiment, a non-volatile semiconductor memory device includes: a tunnel insulation film provided on a semiconductor substrate; a floating gate electrode provided on the tunnel insulation film; an inter-electrode insulation film provided on the floating gate electrode; and a control gate electrode provided on the inter-electrode insulation film. The inter-electrode insulation film includes: a lower insulation film provided on the floating gate electrode side; and an upper insulation film provided on the control gate electrode side. The lower insulation film includes: N (N is an integer of 2 or larger) electric charge accumulation layers; and boundary insulation films provided between the electric charge accumulation layers.

19 Claims, 5 Drawing Sheets

(56) References Cited

U.S. PATENT DOCUMENTS

2013/0341698 A1* 12/2013 Sato .................. H01L 21/28273
257/316
2013/0341699 A1 12/2013 Sato
2014/0315378 A1 10/2014 Sato
2014/0352329 A1* 12/2014 Bloedow ................ F25B 21/02
62/3.6

* cited by examiner

NON-VOLATILE SEMICONDUCTOR MEMORY DEVICE

CROSS-REFERENCE TO RELATED APPLICATIONS

This application is based upon and claims the benefit of priority from U.S. Provisional Application No. 62/306,993, filed on Mar. 11, 2016; the entire contents of which are incorporated herein by reference.

FIELD

Embodiments described herein relate generally to a non-volatile semiconductor memory device.

BACKGROUND

In a process for manufacturing a non-volatile semiconductor memory device, a high-dielectric film may be used as inter-electrode insulation film to cope with finer memory cells.

DETAILED DESCRIPTION

In general, according to one embodiment, a non-volatile semiconductor memory device includes: a tunnel insulation film provided on a semiconductor substrate; a floating gate electrode provided on the tunnel insulation film; an inter-electrode insulation film provided on the floating gate electrode; and a control gate electrode provided on the inter-electrode insulation film. The inter-electrode insulation film includes a lower insulation film provided on the floating gate electrode side and an upper insulation film provided on the control gate electrode side. The lower insulation film includes N (N is an integer of 2 or larger) electric charge accumulation layers and boundary insulation films provided between the electric charge accumulation layers.

Exemplary embodiments of a non-volatile semiconductor memory device will be explained below in detail with reference to the accompanying drawings. The present invention is not limited to the following embodiments.

First Embodiment

Figure 1:
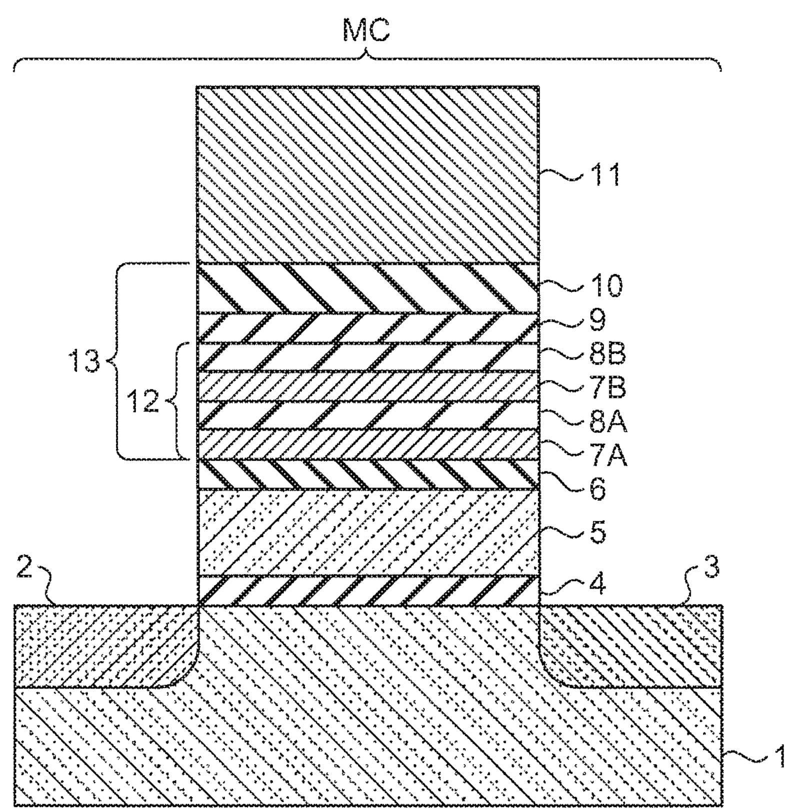
FIG. 1 is a cross-sectional view of a memory cell applied to a non-volatile semiconductor memory device according to a first embodiment.

FIG. 1 is a cross-sectional view of a memory cell applied to a non-volatile semiconductor memory device according to a first embodiment.

Referring to FIG. 1, a semiconductor substrate 1 is provided with impurity diffused layers 2 and 3. The impurity diffused layers 2 and 3 can be used as a source layer and a drain layer. In the semiconductor substrate 1, a channel layer can be formed between the impurity diffused layers 2 and 3. The material for the semiconductor substrate 1 can be Si, Ge, SiGe, GaAs, GaAlAs, InP, GaP, GaN, SiC, InGaAsP, or the like, for example. A tunnel insulation film 4 is provided on the channel layer of the semiconductor substrate 1. The material for the tunnel insulation film 4 may be $SiO_2$, for example. The film thickness of the tunnel insulation film 4 can be set to 6 nm or less.

A floating gate electrode 5 is provided on the tunnel insulation film 4. The material for the floating gate electrode 5 can be a semiconductor. For example, the floating gate electrode 5 can be formed a material including Si as a main ingredient such as polysilicon, for example. An impurity such as P may be doped in the floating gate electrode 5. The film thickness of the floating gate electrode 5 can be set to 4 nm or more. An interface insulation film 6 is provided on the floating gate electrode 5.

For the interface insulation film 6, a material smaller in diffusion constant of a metal included in an inter-electrode insulation film 13 than the floating gate electrode 5 can be selected. The interface insulation film 6 can be used as a diffusion preventive film for the metal included in the inter-electrode insulation film 13. In addition, for the interface insulation film 6, a material without oxidizability of the metal included in the inter-electrode insulation film 13 can be selected. For example, the material for the interface insulation film 6 can be SiN.

The inter-electrode insulation film 13 is provided on the interface insulation film 6. The inter-electrode insulation film 13 can include a lower insulation film 12, an intermediate insulation film 9, and an upper insulation film 10. The lower insulation film 12 includes electric charge accumulation layers 7A and 7B and boundary insulation films 8A and 8B. The boundary insulation film 8A is provided between the electric charge accumulation layers 7A and 7B. The boundary insulation film 8B is provided between the electric charge accumulation layer 7B and the intermediate insulation film 9.

For the electric charge accumulation layers 7A and 7B, a material with a deeper potential for the electric charges accumulated on the floating gate electrode 5 than the floating gate electrode 5 can be selected. The material for the electric charge accumulation layers 7A and 7B can be a metal.

For example, the material for the electric charge accumulation layers 7A and 7B can be Ru. Instead of Ru, the material for the electric charge accumulation layers 7A and 7B may be Ti, Ta, Pt, Ir, or W. The material for the electric charge accumulation layers 7A and 7B may be a conductive nitride such as TiN or TaN. The material for the electric charge accumulation layers 7A and 7B may be any other material with a Fermi level in a conductor. For the boundary insulation films 8A and 8B, a material with a deeper potential for the electric charges accumulated on the floating gate electrode 5 than the electric charge accumulation layers 7A and 7B can be selected.

For the boundary insulation films 8A and 8B and the upper insulation film 10, a material higher in dielectric constant than the intermediate insulation film 9 can be selected. The film thicknesses of the electric charge accumulation layers 7A and 7B, the boundary insulation films 8A and 8B, the intermediate insulation film 9, and the upper insulation film 10 can be set to 10 nm or less.

Barrier height relative to the electric charges accumulated on the floating gate electrode 5 can be larger in the intermediate insulation film 9 than the boundary insulation films 8A and 8B and the upper insulation film 10. The intermediate insulation film 9 can include a first element. The first element may be Si or Al, for example. The material for the intermediate insulation film 9 can be an oxide of the first element. The boundary insulation films 8A and 8B and the upper insulation film 10 can include the first element and a second element.

The second element may be Hf, Zr, Ta, Y, La, or Ti, for example. The materials for the boundary insulation films 8A and 8B and the upper insulation film 10 can be a composite oxide of the first element and the second element. The composite oxide of the first element and the second element can have a crystal structure. In the crystal structure, the metallic element included in the electric charge accumulation layers 7A and 7B is higher in substitutability for the first element than the second element.

For example, the material for the intermediate insulation film 9 can be $SiO_x$ (x is a positive real number). In this case, the material for the boundary insulation films 8A and 8B and the upper insulation film 10 can be $HfSiO_x$. Alternatively, the material for the intermediate insulation film 9 can be $Al_2O_3$. In this case, the material for the boundary insulation films 8A and 8B and the upper insulation film 10 can be $Hf_{1-x}Al_xO_y$ (x and y are positive real numbers). A control gate electrode 11 is provided on the inter-electrode insulation film 13. The material for the control gate electrode 11 can be W or WN, for example.

Providing the tunnel insulation film 4, the floating gate electrode 5, the interface insulation film 6, the inter-electrode insulation film 13, and the control gate electrode 11 on the semiconductor substrate 1 can form a memory cell MC. The floating gate electrode 5 and the lower insulation film 12 can be separated in each memory cell MC. Then, arranging the memory cells MC in a matrix in a row direction and a column direction can form a memory cell array. The memory cell array can be used in an NAND flash memory. In this case, the control gate electrode 11 can be used as a word line, and the control gate electrode 11 can be shared between a plurality of memory cells MC belonging to the same row.

The electric charge accumulation layers 7A and 7B can be deposited by physical vapor deposition (PVD), for example. The boundary insulation films 8A and 8B can be deposited by atomic layer deposition (ALD) or chemical vapor deposition (CVD), for example.

Alternatively, the electric charge accumulation layers 7A and 7B and the boundary insulation films 8A and 8B may be continuously deposited by ALD or CVD. Source gases, deposition temperatures, and the like can be switched between the deposition of the electric charge accumulation layers 7A and 7B and the deposition of the boundary insulation films 8A and 8B. The electric charge accumulation layers 7A and 7B and the boundary insulation films 8A and 8B can be patterned with the use of a mask for patterning the floating gate electrode 5.

Figure 2:
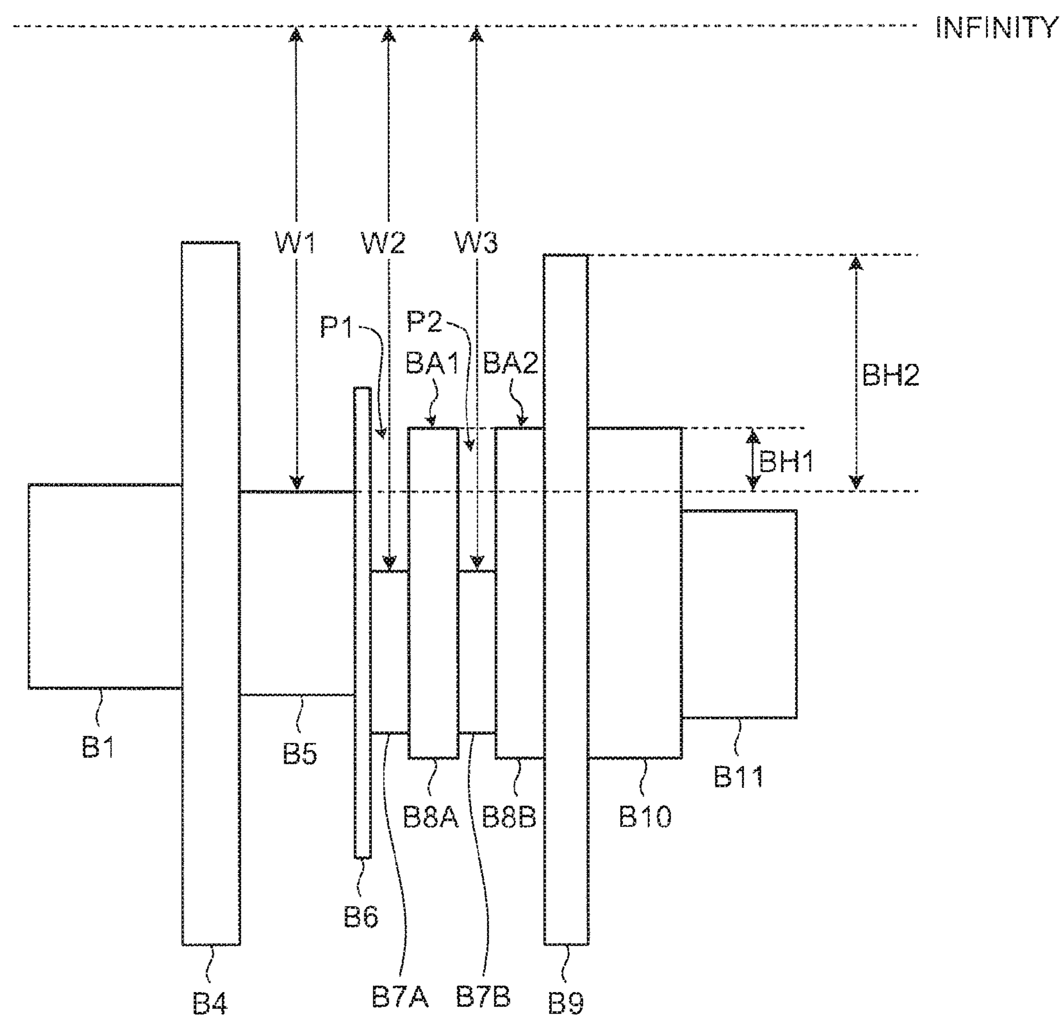
FIG. 2 is a diagram illustrating an energy band structure when no external electric field is impressed to the memory cell applied to the non-volatile semiconductor memory device according to the first embodiment.

FIG. 2 is a diagram illustrating an energy band structure when no external electric field is impressed to the memory cell applied to the non-volatile semiconductor memory device according to the first embodiment.

Referring to FIG. 2, the semiconductor substrate 1 has an energy band B1. The tunnel insulation film 4 has an energy band B4. The floating gate electrode 5 has an energy band B5. The interface insulation film 6 has an energy band B6. The electric charge accumulation layers 7A and 7B have energy bands B7A and B7B, respectively. The boundary insulation films 8A and 8B have energy bands B8A and B8B, respectively. The intermediate insulation film 9 has an energy band B9. The upper insulation film 10 has an energy band B10. The control gate electrode 11 has an energy band B11.

The energy bands B7A and B7B are deeper in potential for electric charges accumulated on the floating gate electrode 5 than the energy band B5. Work functions W2 and W3 of the electric charge accumulation layers 7A and 7B can be larger than a work function W1 of the floating gate electrode 5. When the materials for the electric charge accumulation layers 7A and 7B are the same, the work functions W2 and W3 are equal. The lower insulation film 12 can be configured to have two potential wells P1 and P2 for the electric charges accumulated on the floating gate electrode 5 between the interface insulation film 6 and the intermediate insulation film 9.

Alternatively, the lower insulation film 12 can have two potential barriers BA1 and BA2 for the electric charges accumulated on the floating gate electrode 5. In this case, the potential barriers BA1 and BA2 are separated from each other in a direction in which the electric charges accumulated on the floating gate electrode 5 move from the floating gate electrode 5 to the control gate electrode 11.

A barrier height BH2 of the intermediate insulation film 9 relative to the electric charges accumulated on the floating gate electrode 5 is larger than a barrier height BH1 of the boundary insulation films 8A and 8B and the upper insulation film 10. FIG. 2 illustrates the barrier heights BH1 and BH2 as energy levels at conduction band edges of the upper insulation film 10, the boundary insulation films 8A and 8B, and the intermediate insulation film 9 relative to an energy level at a conduction band edge of the semiconductor substrate 1 when the energy band is flat.

Figure 3:
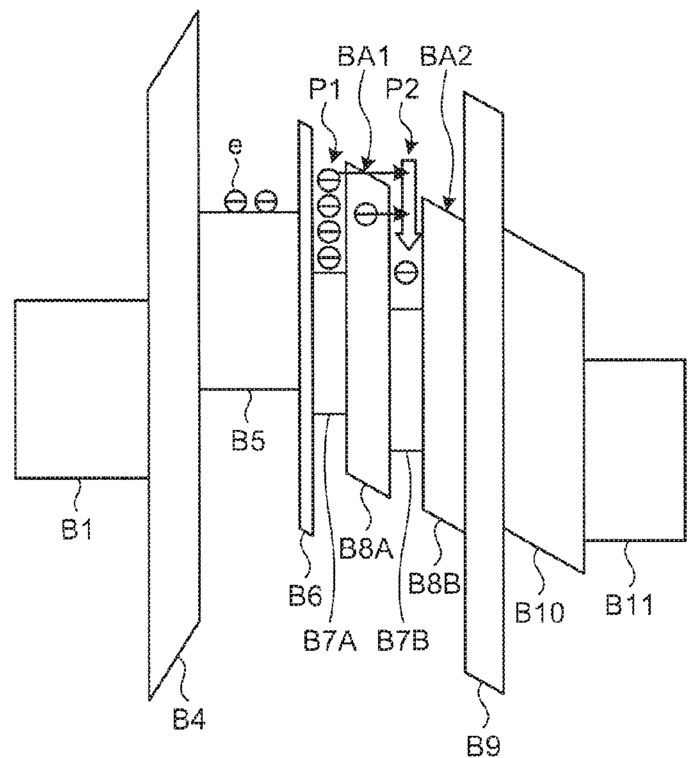
FIG. 3 is a diagram illustrating an energy band structure when electric charges e are accumulated on the memory cell applied to the non-volatile semiconductor memory device according to the first embodiment.

FIG. 3 is a diagram illustrating an energy band structure when electric charges e are accumulated on the memory cell applied to the non-volatile semiconductor memory device according to the first embodiment.

Referring to FIG. 3, at the time of writing the memory cell, a positive voltage is applied to the control gate electrode 11 relative to the semiconductor substrate 1. At that time, the electric charges e of the semiconductor substrate 1 passes through the tunnel insulation film 4 due to tunneling effect and accumulate on the floating gate electrode 5.

Further, some of the electric charges e having passed through the tunnel insulation film 4 then pass through the interface insulation film 6 due to tunneling effect and accumulate on the electric charge accumulation layer 7A. Forming the floating gate electrode 5 from a semiconductor material facilitates delivery of the electric charges e from the semiconductor substrate 1 to the floating gate electrode 5, thereby enhancing efficiency of writing operation.

At the time of holding of the memory cell, an external electric field impressed to the memory cell is canceled. At that time, the electric charges e accumulated on the electric charge accumulation layer 7A can be confined in the potential well P1. However, some of the electric charges e confined in the potential well P1 pass through the potential barrier BA1. The electric charges e having passed through the potential barrier BA1 can be caught on the electric charge accumulation layer 7B and confined in the potential well P2. Accordingly, it is possible to make the electric charges e accumulated on the lower insulation film 12 unlikely to move to the control gate electrode 11 and improve the property of the memory cell holding the electric charges e.

When the electric charges e are accumulated on the electric charge accumulation layers 7A and 7B, the work functions W2 and W3 of the electric charge accumulation layers 7A and 7B become smaller. Since the electric charges e accumulated on the electric charge accumulation layer 7B are smaller in volume than the electric charges e accumulated on the electric charge accumulation layer 7A, the work function W3 of the electric charge accumulation layer 7B is larger than the work function W2 of the electric charge accumulation layer 7A. Accordingly, the electric charge accumulation layer 7B is deeper in potential for the electric charges e than the electric charge accumulation layer 7A and can catch efficiently the electric charges e having passed through the potential barrier BA1.

In addition, by making the barrier height BH2 of the intermediate insulation film 9 larger than the barrier height BH1 of the boundary insulation films 8A and 8B and the upper insulation film 10, it is possible to make the electric charges e accumulated on the lower insulation film 12 unlikely to move to the control gate electrode 11 and reduce leakage of the electric charges e from the lower insulation film 12 to the control gate electrode 11.

In the embodiment described above, the lower insulation film 12 is configured to have the two potential wells P1 and P2 for the electric charges e between the interface insulation film 6 and the intermediate insulation film 9. Alternatively, the lower insulation film 12 may be configured to have N (N is an integer of 2 or larger) potential wells for the electric charges e between the interface insulation film 6 and the intermediate insulation film 9.

In the embodiment described above, the lower insulation film 12 has the two potential barriers BA1 and BA2 for the electric charges e. Alternatively, the lower insulation film 12 may have N (N is an integer of 2 or larger) divided potential barriers for the electric charges e.

Second Embodiment

Figure 4:
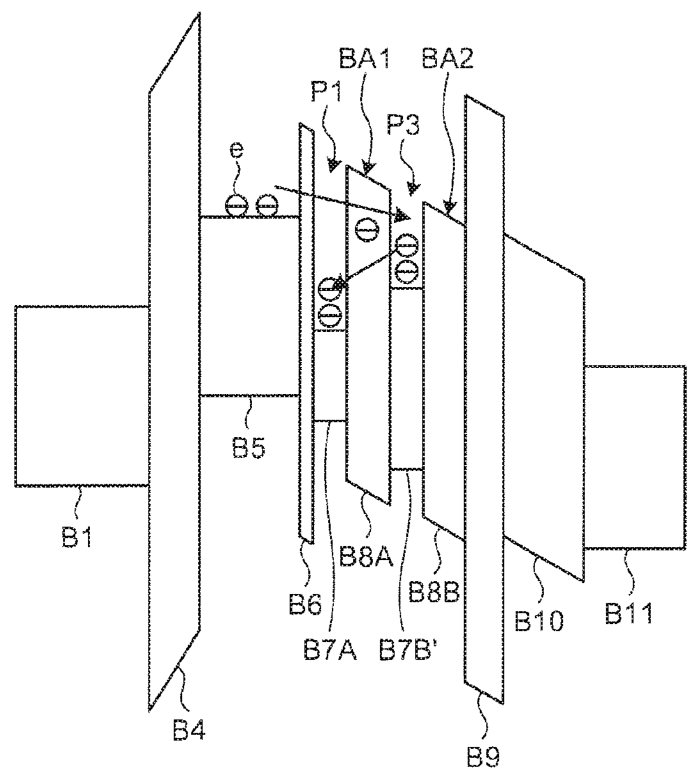
FIG. 4 is a diagram illustrating an energy band structure when electric charges e are accumulated on a memory cell applied to a non-volatile semiconductor memory device according to a second embodiment.

FIG. 4 is a diagram illustrating an energy band structure when electric charges e are accumulated on a memory cell applied to a non-volatile semiconductor memory device according to a second embodiment.

FIG. 1 illustrates the case in which the same metallic material is used for the electric charge accumulation layers 7A and 7B. FIG. 4 illustrates the case in which different metals are used for the electric charge accumulation layers 7A and 7B. For example, the material for the electric charge accumulation layer 7A may be Ru and the material for the electric charge accumulation layer 7B may be TiN, for example. In this case, the electric charge accumulation layer 7B has an energy band B7B' and the work function W3 of the electric charge accumulation layer 7B can be smaller than the work function W2 of the electric charge accumulation layer 7A. The electric charge accumulation layer 7B has a potential well P3 formed on the lower insulation film 12. The potential well P3 can be shallower than the potential well P1.

At the time of holding of the memory cell, the electric charges e accumulated on the electric charge accumulation layer 7A can be confined in the potential well P1. However, some of the electric charges e confined in the potential well P1 pass through the potential barrier BA1. At that time, the electric charges e having passed through the potential barrier BA1 can be caught on the electric charge accumulation layer 7B and confined in the potential well P3.

Since the potential well P3 is shallower than the potential well P1, the electric charges e confined in the potential well P3 can be returned to the potential well P1. Accordingly, it is possible to make the electric charges e accumulated on the lower insulation film 12 unlikely to move to the control gate electrode 11, and improve the property of the memory cell holding the electric charges e.

Third Embodiment

Figure 5:
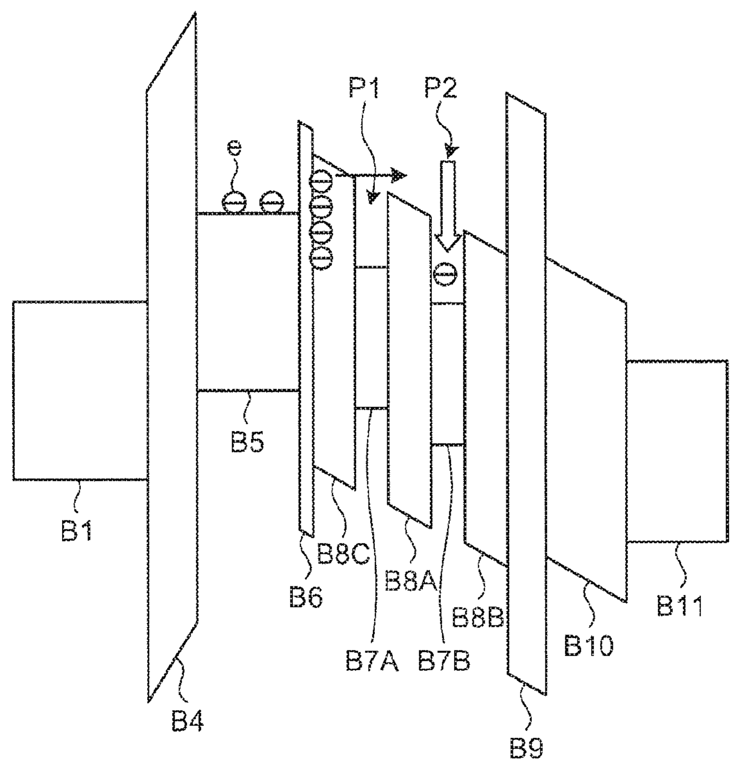
FIG. 5 is a diagram illustrating an energy band structure when electric charges e are accumulated on a memory cell applied to a non-volatile semiconductor memory device according to a third embodiment.

FIG. 5 is a diagram illustrating an energy band structure when electric charges e are accumulated on a memory cell applied to a non-volatile semiconductor memory device according to a third embodiment.

In the configuration of FIG. 5, a boundary insulation film is added to the configuration of FIG. 1. The boundary insulation film can be provided between the interface insulation film 6 and the electric charge accumulation layer 7A.

The boundary insulation film has an energy band B8C. The boundary insulation film can be configured in the same manner as the boundary insulation films 8A and 8B. The potential well P1 can be arranged between the energy bands B8C and B8A, and the potential well P2 can be arranged between the energy bands B8A and B8B. Accordingly, the same advantageous effects as those of the configuration of FIG. 1 can be provided even when the boundary insulation film is provided between the interface insulation film 6 and the electric charge accumulation layer 7A.

Fourth Embodiment

Figure 6:
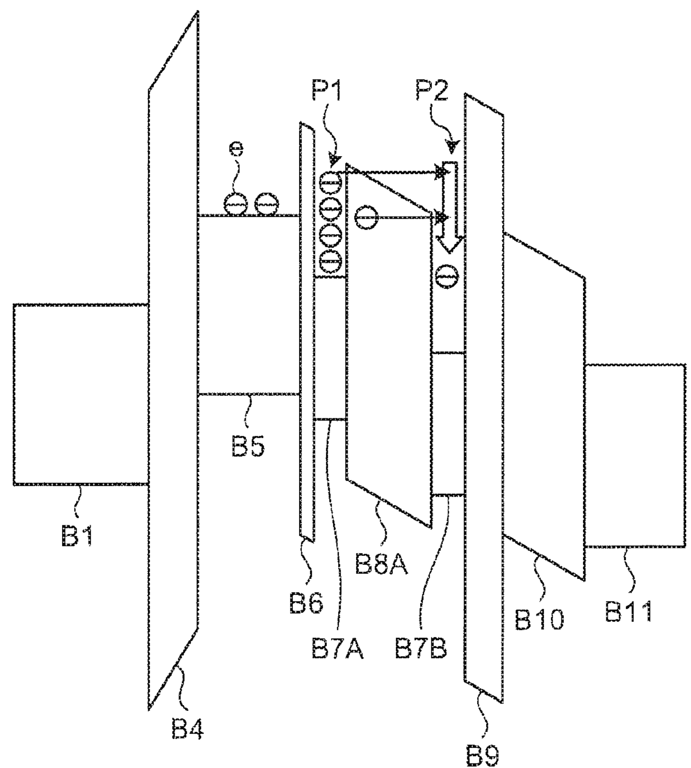
FIG. 6 is a diagram illustrating an energy band structure when electric charges e are accumulated on a memory cell applied to a non-volatile semiconductor memory device according to a fourth embodiment.

FIG. 6 is a diagram illustrating an energy band structure when electric charges e are accumulated on a memory cell applied to a non-volatile semiconductor memory device according to a fourth embodiment.

In the configuration of FIG. 6, the boundary insulation film 8B of FIG. 1 is removed. In this case, in the configuration of FIG. 6, the film thickness of the boundary insulation film 8A can be larger than that in the configuration of FIG. 1. In this case, the potential well P1 can be arranged between the energy bands B6 and B8A, and the potential well P2 can be arranged between the energy bands B8A and B9. Accordingly, the same advantageous effects as those of the configuration of FIG. 1 can be provided even when the boundary insulation film 8B is removed.

Fifth Embodiment

Figure 7:
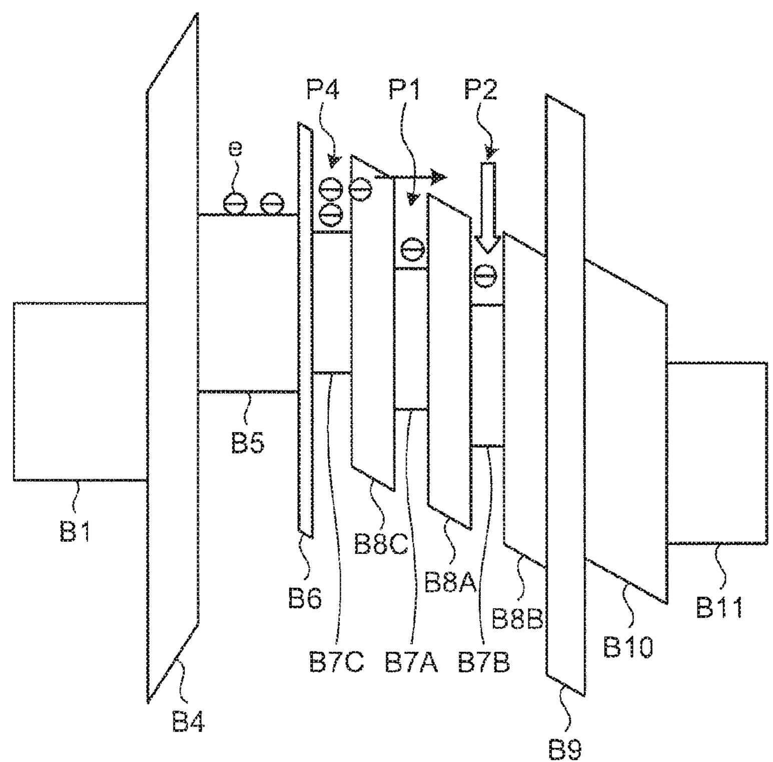
FIG. 7 is a diagram illustrating an energy band structure when electric charges e are accumulated on a memory cell applied to a non-volatile semiconductor memory device according to a fifth embodiment.

FIG. 7 is a diagram illustrating an energy band structure when electric charges e are accumulated on a memory cell applied to a non-volatile semiconductor memory device according to a fifth embodiment.

In the configuration of FIG. 7, an electric charge accumulation layer is added to the configuration of FIG. 5. The electric charge accumulation layer can be provided between the interface insulation film 6 and the boundary insulation film. The electric charge accumulation layer has an energy band B7C. The electric charge accumulation layer can be configured in the same manner as the electric charge accumulation layers 7A and 7B.

In this case, a potential well P4 can be arranged between the energy bands B6 and B8C, the potential well P1 can be arranged between the energy bands B8C and B8A, and the potential well P2 can be arranged between the energy bands B8A and B8B. By providing the three potential wells P1, P2, and P4 between the interface insulation film 6 and the intermediate insulation film 9, it is possible to improve the property of holding the electric charges e as compared to the configuration of FIG. 5.

Sixth Embodiment

Figure 8:
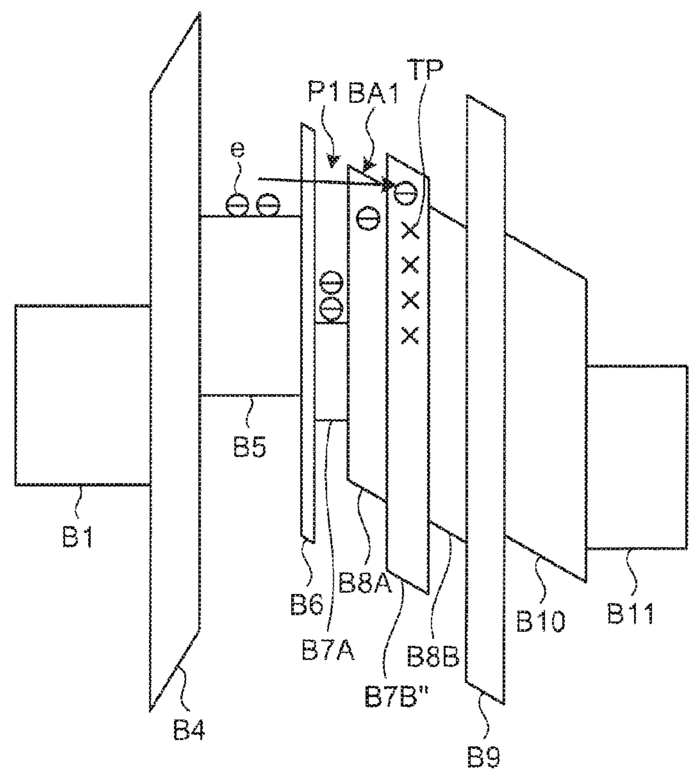
FIG. 8 is a diagram illustrating an energy band structure when electric charges e are accumulated on a memory cell applied to a non-volatile semiconductor memory device according to a sixth embodiment.

FIG. 8 is a diagram illustrating an energy band structure when electric charges e are accumulated on a memory cell applied to a non-volatile semiconductor memory device according to a sixth embodiment.

In the configuration of FIG. 8, a charge trap film is provided instead of the electric charge accumulation layer 7B of FIG. 1. The material for the charge trap film can be SiN, for example. The charge trap film has an energy band B7B". The energy band B7B" is provided with a trap level TP. The material for the charge trap film is preferably selected such that the trap level TP at the time of writing is in a position shallower than a surface level of the electric charge accumulation layer 7A.

At the time of holding of the memory cell, the electric charges e accumulated on the electric charge accumulation layer 7A can be confined in the potential well P1. However, some of the electric charges e confined in the potential well P1 pass through the potential barrier BA1. At that time, the electric charges e having passed through the potential barrier BA1 are caught in the trap level TP. Accordingly, it is possible to make the electric charges e accumulated on the lower insulation film 12 unlikely to move to the control gate electrode 11 and improve the property of the memory cell holding the electric charges e.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
- a tunnel insulation film provided on a semiconductor layer;
- a floating gate electrode provided on the tunnel insulation film;
- an inter-electrode insulation film provided on the floating gate electrode; and
- a control gate electrode provided on the inter-electrode insulation film, wherein
- the inter-electrode insulation film includes:
  - a first insulation film provided on the floating gate electrode side;
  - a second insulation film provided on the control gate electrode side; and
  - an intermediate insulation film provided between the first insulation film and the second insulation film, and
  - the first insulation film includes:
  - N (N is an integer of 2 or larger) electric charge accumulation layers; and
  - boundary insulation films provided between the electric charge accumulation layers, wherein
- the materials for the boundary insulation films and the second insulation film are the same.

2. The non-volatile semiconductor memory device of claim 1, wherein the boundary insulation films are provided between the electric charge accumulation layers and between the electric charge accumulation layer and the intermediate insulation film.

3. The non-volatile semiconductor memory device of claim 1, wherein the electric charge accumulation layers have larger work functions than that of the floating gate electrode.

4. The non-volatile semiconductor memory device of claim 3, wherein
- the electric charge accumulation layers include:
- a first electric charge accumulation layer with a first work function; and
- a second electric charge accumulation layer with a second work function.

5. The non-volatile semiconductor memory device of claim 4, wherein the first electric charge accumulation layer is formed from Ru, and the second electric charge accumulation layer is formed from TiN.

6. The non-volatile semiconductor memory device of claim 1, wherein
- the floating gate electrode is formed from a semiconductor, and
- the electric charge accumulation layers are formed from a metal.

7. The non-volatile semiconductor memory device of claim 6, wherein the floating gate electrode has Si as a main ingredient, and the electric charge accumulation layers are formed from Ru.

8. The non-volatile semiconductor memory device of claim 1, wherein at least one of the electric charge accumulation layers is a charge trap film.

9. The non-volatile semiconductor memory device of claim 1, wherein barrier height for electric charges accumulated on the floating gate electrode is larger in the boundary insulation films than the electric charge accumulation layers.

10. The non-volatile semiconductor memory device of claim 1, wherein the electric charge accumulation layers have potentials for confining the electric charges on the first insulation film.

11. The non-volatile semiconductor memory device of claim 10, wherein the electric charge accumulation layers have N potential wells on the first insulation film.

12. The non-volatile semiconductor memory device of claim 1, wherein barrier height for the electric charges accumulated on the floating gate electrode is larger in the intermediate insulation film than the boundary insulation films and the second insulation film.

13. The non-volatile semiconductor memory device of claim 1, comprising an interface insulation film between the floating gate electrode and the inter-electrode insulation film.

14. A non-volatile semiconductor memory device comprising:

a tunnel insulation film provided on a semiconductor layer;

a floating gate electrode provided on the tunnel insulation film;

an inter-electrode insulation film provided on the floating gate electrode; and a control gate electrode provided on the inter-electrode insulation film, wherein the inter-electrode insulation film includes:

a first insulation film provided on the floating gate electrode side;

a second insulation film provided on the control gate electrode side; and an intermediate insulation film provided between the first insulation film and the second insulation film, and the first insulation film includes:

N (N is an integer of 2 or larger) electric charge accumulation layers; and boundary insulation films provided between the electric charge accumulation layers, wherein the boundary insulation films and the second insulation film are higher in dielectric constant than the intermediate insulation film.

15. A non-volatile semiconductor memory device comprising:

a tunnel insulation film provided on a semiconductor layer;

a floating gate electrode provided on the tunnel insulation film;

an inter-electrode insulation film provided on the floating gate electrode; and a control gate electrode provided on the inter-electrode insulation film, wherein the inter-electrode insulation film includes:

a first insulation film provided on the floating gate electrode side;

a second insulation film provided on the control gate electrode side; and an intermediate insulation film provided between the first insulation film and the second insulation film, and the first insulation film includes:

N (N is an integer of 2 or larger) electric charge accumulation layers; and boundary insulation films provided between the electric charge accumulation layers, wherein the intermediate insulation film consists of an oxide of a first element, and the boundary insulation films and the second insulation film consist of an oxide of the first element and a second element.

16. The non-volatile semiconductor memory device of claim 15, wherein the first element is Si and the second element is Hf.

17. The non-volatile semiconductor memory device of claim 16, wherein the intermediate insulation film consists of $SiO_x$ (x is a positive real number), and the boundary insulation films and the second insulation film consist of $HfSiO_x$.

18. A non-volatile semiconductor memory device comprising:

a tunnel insulation film provided on a semiconductor layer;

a floating gate electrode provided on the tunnel insulation film;

an inter-electrode insulation film provided on the floating gate electrode;

a control gate electrode provided on the inter-electrode insulation film; and an interface insulation film provided between the floating gate electrode and the inter-electrode insulation film, wherein the inter-electrode insulation film includes:

first insulation film provided on the floating gate electrode side;

a second insulation film provided on the control gate electrode side; and an intermediate insulation film provided between the first insulation film and the second insulation film, and the first insulation film is configured to have N (N is an integer of 2 or larger) potential wells for electric charges accumulated on the floating gate electrode between the interface insulation film and the intermediate insulation film.

19. A non-volatile semiconductor memory device comprising:

a tunnel insulation film provided on a semiconductor layer;

a floating gate electrode provided on the tunnel insulation film;

an inter-electrode insulation film provided on the floating gate electrode;

a control gate electrode provided on the inter-electrode insulation film; and an interface insulation film provided between the floating gate electrode and the inter-electrode insulation film, wherein the inter-electrode insulation film includes:

a first insulation film provided on the floating gate electrode side;

a second insulation film provided on the control gate electrode side; and an intermediate insulation film provided between the first insulation film and the second insulation film, and the first insulation film is configured to have N (N is an integer of 2 or lager) potential barriers for electric charges accumulated on the floating gate electrode, and the potential barriers are divided in a direction in which the electric charges move from the floating gate electrode to the control gate electrode.

* * * * *